United States Patent
Higo et al.

(10) Patent No.: US 9,172,029 B2
(45) Date of Patent: Oct. 27, 2015

(54) STORAGE ELEMENT AND MEMORY

(71) Applicant: Sony Corporation, Tokyo (JP)

(72) Inventors: Yutaka Higo, Kanagawa (JP); Masanori Hosomi, Kanagawa (JP); Hiroyuki Ohmori, Kanagawa (JP); Tetsuya Yamamoto, Kanagawa (JP); Kazutaka Yamane, Kanagawa (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/288,005

(22) Filed: May 27, 2014

(65) Prior Publication Data

US 2014/0264674 A1  Sep. 18, 2014

Related U.S. Application Data

(63) Continuation of application No. 11/874,045, filed on Oct. 17, 2007, now abandoned.

(30) Foreign Application Priority Data

Dec. 12, 2006 (JP) .................... 2006-335016

(51) Int. Cl.
*H01L 43/08* (2006.01)
*G11C 11/00* (2006.01)
(Continued)

(52) U.S. Cl.
CPC ............. *H01L 43/02* (2013.01); *B82Y 25/00* (2013.01); *G11C 11/16* (2013.01); *H01F 10/329* (2013.01);
(Continued)

(58) Field of Classification Search
CPC ........ H01L 43/08; H01L 43/10; G11C 11/16; G11C 11/161
USPC ................... 257/421, 422, E43.004, E43.005; 365/158, 171
See application file for complete search history.

(56) References Cited

U.S. PATENT DOCUMENTS 6,005,800 A   12/1999  Koch et al.
6,303,218 B1  10/2001  Kamiguchi et al.
(Continued)

FOREIGN PATENT DOCUMENTS

EP    1693854       8/2006
JP    2001-202604   7/2001
(Continued)

OTHER PUBLICATIONS

Japanese Office Action issued Feb. 24, 2009 for corresponding Japanese Appln. No. 2006-335016.

*Primary Examiner* — Allison P Bernstein
(74) *Attorney, Agent, or Firm* — K&L Gates LLP

(57) ABSTRACT

A storage element includes a storage layer, a fixed magnetization layer, a spin barrier layer, and a spin absorption layer. The storage layer stores information based on a magnetization state of a magnetic material. The fixed magnetization layer is provided for the storage layer through a tunnel insulating layer. The spin barrier layer suppresses diffusion of spin-polarized electrons and is provided on the side of the storage layer opposite the fixed magnetization layer. The spin absorption layer is formed of a nonmagnetic metal layer causing spin pumping and provided on the side of the spin barrier layer opposite the storage layer. A direction of magnetization in the storage layer is changed by passing current in a layering direction to inject spin-polarized electrons so that information is recorded in the storage layer and the spin barrier layer includes at least a material selected from oxides, nitrides, and fluorides.

18 Claims, 5 Drawing Sheets

(51) Int. Cl.
    *H01L 43/02* (2006.01)
    *B82Y 25/00* (2011.01)
    *G11C 11/16* (2006.01)
    *H01F 10/32* (2006.01)
    *H01F 41/32* (2006.01)
    *H01L 27/22* (2006.01)

(52) U.S. Cl.
    CPC .......... *H01F 10/3254* (2013.01); *H01F 41/325* (2013.01); *H01L 43/08* (2013.01); *H01F 10/3272* (2013.01); *H01L 27/228* (2013.01)

(56) References Cited

U.S. PATENT DOCUMENTS

| | | |
|---|---|---|
| 6,829,161 B2 | 12/2004 | Huai et al. |
| 6,855,563 B2 | 2/2005 | Motoyoshi |
| 7,057,921 B2 | 6/2006 | Valet |
| 7,099,122 B2 | 8/2006 | Yi et al. |
| 7,449,345 B2 | 11/2008 | Horng et al. |
| 7,468,541 B2 | 12/2008 | Fukuzumi |
| 7,606,063 B2 | 10/2009 | Shen et al. |
| 2002/0048128 A1 | 4/2002 | Kamiguchi et al. |
| 2003/0123197 A1 | 7/2003 | Mizuguchi et al. |
| 2004/0145850 A1 | 7/2004 | Fukumoto et al. |
| 2005/0185454 A1 | 8/2005 | Brown et al. |
| 2005/0237787 A1 | 10/2005 | Huai et al. |
| 2005/0254286 A1 | 11/2005 | Valet |
| 2005/0254287 A1 | 11/2005 | Valet |
| 2006/0003185 A1 | 1/2006 | Parkin |
| 2006/0128038 A1 | 6/2006 | Pakala et al. |
| 2006/0262594 A1 | 11/2006 | Fukumoto |
| 2007/0076471 A1* | 4/2007 | Kano et al. ............ 365/158 |
| 2007/0096229 A1 | 5/2007 | Yoshikawa et al. |
| 2007/0171694 A1* | 7/2007 | Huai et al. ............ 365/145 |
| 2007/0253119 A1 | 11/2007 | Carey et al. |

FOREIGN PATENT DOCUMENTS

| | | |
|---|---|---|
| JP | 2003-017782 | 1/2003 |
| JP | 2003-281705 | 10/2003 |
| JP | 2006-108316 | 4/2006 |
| JP | 2006-237154 | 9/2006 |
| JP | 2006-295001 | 10/2006 |
| JP | 2007-281247 | 10/2007 |

* cited by examiner

70

80

STORAGE ELEMENT AND MEMORY

CROSS-REFERENCES TO RELATED APPLICATIONS

The present application is a continuation of U.S. application Ser. No. 11/874,045, filed on Oct. 17, 2007, which claims priority to Japanese Patent Application JP 2006-335016, filed in the Japanese Patent Office on Dec. 12, 2006, the entire contents of which are incorporated herein by reference.

BACKGROUND

The present application relates to a storage element including a storage layer, in which a magnetization state of a ferromagnetic layer is stored as information, and a fixed magnetization layer, a magnetization direction of which is fixed, where the magnetization direction of the storage layer can be changed by applying a current in the direction perpendicular to the plane of the film to inject spin-polarized electrons. The present application also relates to a memory including such storage element, and can be favorably applied to a nonvolatile memory.

High-speed, high-density DRAM is widely used as random access memory in computers and other information devices.

However, because DRAM is volatile memory, the information within which disappears when power is turned off. Hence, there is a demand for nonvolatile memory in which information may not disappear when there is no power.

As such a nonvolatile memory, magnetic random access memory (MRAM), in which information is recorded using magnetization in a magnetic material, is attracting attention and is currently under development.

In MRAM, currents flow through two types of substantially perpendicular address lines (word lines and bit lines), and information is recorded by inverting magnetization in a magnetic layer of a magnetic storage element at an intersection of the address lines using an electric current-induced magnetic field generated by the address lines. When information is read, magnetoresistive effect (MR effect) is used, in which the resistance changes according to the direction of magnetization in the storage layer of the magnetic storage element.

FIG. 1 shows a schematic (perspective) view of a typical MRAM device.

Drain regions 108, source regions 107, and gate electrodes 101, forming selection transistors to select memory cells, are formed in portions separated by element separation layers 102 in a silicon substrate or other semiconductor substrate 110. Above the gate electrodes 101 are provided word lines 105 extending in the front-back direction in the figure.

The drain regions 108 are formed so as to be shared by selection transistors on the left and right in the figure. Lines 109 are connected to the drain regions 108.

Between the word lines 105 and the bit lines 106, which are positioned above the word lines 105 and extend in the left-right direction in the figure, are positioned magnetic storage elements 103 having a magnetic layer the magnetization direction of which is inverted. These magnetic storage elements 103 include, for example, magnetic tunnel junction (MTJ) elements. Further, the magnetic storage elements 103 are electrically connected to the source regions 107 through horizontal-direction bypass lines 111 and a contact layer 104 in the vertical direction. By passing currents through a word line 105 and a bit line 106, a current-induced magnetic field is applied to a magnetic storage element 103, thereby inverting the direction of magnetization in the storage layer of the magnetic storage element 103 and information can be recorded.

In MRAM and other magnetic memories, in order to store recorded information stably, the magnetic layer (storage layer) in which information is recorded may need to have a constant coercive force. On the other hand, in order to overwrite recorded information, a certain amount of electric current may need to pass through address lines. However, since elements forming MRAM are made finer, address lines also grow narrower, so that it is difficult to pass a sufficiently large current.

Hence, in order to invert magnetization using small currents, memory configured to use magnetization inversion caused by spin injection has been attracting attention (see, for example, Japanese Unexamined Patent Application Publication No. 2003-17782). Magnetization inversion caused by spin injection involves injecting spin-polarized electrons passed through a magnetic material into another magnetic material, resulting in torque generated on the other magnetic material and causing the magnetization inversion.

For example, by passing current in the direction perpendicular to the plane of a film of a giant magnetoresistive effect (GMR) element or a magnetic tunnel junction (MTJ) element, the direction of magnetization in at least part of the magnetic layers of these elements can be inverted.

Moreover, magnetization inversion by spin injection has such an advantage that the magnetization inversion is effected without increasing the current, even if the element is very small.

FIGS. 2 and 3 are schematic views of memory configured to use the magnetization inversion caused by spin injection as described above. FIG. 2 is a perspective view, and FIG. 3 is a cross-sectional view.

Drain regions 58, source regions 57, and gate electrodes 51, forming selection transistors used to select memory cells, are each formed in portions separated by an element separation layer 52 of a silicon substrate or other semiconductor substrate 60. The gate electrodes 51 also serve as word lines extending in the front-back direction in FIG. 2.

The drain regions 58 are formed so as to be shared by selection transistors on the right and left in FIG. 2. Lines 59 are connected to these drain regions 58.

Further, storage elements 53, having a storage layer the magnetization direction of which is inverted by spin injection, are positioned between the source regions 57, and the bit lines 56 positioned above the source regions 57 and extending in the right-left direction in FIG. 2.

Such a storage element 53 includes, for example, a magnetic tunnel junction (MTJ) element. As shown in the figure, magnetic layers 61 and 62 are provided. One of the magnetic layers 61 and 62 is a fixed magnetization layer the magnetization direction of which is fixed, and the other magnetic layer is a free magnetization layer, that is, a storage layer, the magnetization direction of which changes.

The storage element 53 is connected to a bit line 56 and a source region 57 through a vertical contact layer 54. Accordingly, current is passed through the storage element 53 to cause inversion of the direction of magnetization in the storage layer by spin injection.

Memory configured to use magnetization inversion caused by spin injection has the feature of enabling the device structure to be simplified compared with typical MRAM shown in FIG. 1.

Further, when using magnetization inversion caused by spin injection, there is the advantage that the write current is not increased, even when the element size is reduced, compared with typical MRAM in which magnetization inversion is effected by an external magnetic field.

In the case of MRAM, write lines (word lines and bit lines) are provided separately from the storage elements, and by passing a current through the write lines to generate a current-induced magnetic field, information is written (recorded). Accordingly, a sufficiently large current for writing may be passed through the write lines.

On the other hand, in memory configured to use magnetization inversion caused by spin injection, spin injection may need to be carried out by passing a current through storage elements to invert the direction of magnetization in the storage layer.

Because information is written (recorded) by directly passing a current through storage elements as described above, storage elements are connected to selection transistors so that memory cells for writing can be selected. Here, the current flowing through a storage element is limited to the current which can be passed through a selection transistor (saturation current of the selection transistor).

Accordingly, information may need to be written using a current equal to or less than the saturation current of selection transistors. Therefore, the efficiency of spin injection may need to be improved so that current passed through storage elements may be reduced.

Further, in order to obtain a large read signal, a large magnetoresistive change rate may need to be secured. Hence, it is effective to provide a storage element in which a tunnel insulating layer (tunnel barrier layer) serves as an intermediate layer in contact with both sides of the storage layer.

When using a tunnel insulating layer as an intermediate layer as described above, an amount of current passed through the storage element may need to be limited to prevent dielectric breakdown of the tunnel insulating layer. In light of this also, the current during spin injection may need to be controlled.

Hence, storage elements configured to invert the magnetization direction of the storage layer by spin injection may need to improve the spin injection efficiency and reduce the current required.

SUMMARY

When the direction of magnetization in a ferromagnetic material changes with time, an action to impede the change may act on the magnetization of the ferromagnetic material.

The magnitude of this action is expressed by the Gilbert damping constant.

When the magnetization direction in a storage layer is inverted by spin injection, a large torque exceeding such action may need to be applied to the storage layer.

That is, when the Gilbert damping constant is large, a correspondingly large current may need to pass through the storage layer.

However, the ferromagnetic material alone may not determine the Gilbert damping constant, but the value may increase depending on conditions of adjacent layers.

When a current passes through a metal layer adjacent to the ferromagnetic material, and when magnetization of the ferromagnetic material is in motion, a spin current flows in the adjacent metal layer.

When the spin current disappears by spin diffusion in the metal layer, magnetization movement in the ferromagnetic material is suppressed in reaction, that is, the Gilbert damping constant increases.

This phenomenon is referred to as spin pumping.

The spin pumping phenomenon has been experimentally corroborated in detail in, for example, Phys. Rev. B, 66, 104413 (2002), and in Jpn. J. Appl. Phys., 40, 580 (2001).

Thus in storage elements in which the magnetization direction is inverted through spin injection, the Gilbert damping constant may increase depending on metal layers adjacent to a storage layer and, as a result, the current necessary for magnetization inversion (the inversion current) may increase.

Further, it is desirable that the element size of storage layers and saturation magnetization thereof be decreased as much as possible to reduce the inversion current.

However, if element size and saturation magnetization of the storage layer are small, thermal stability of the storage element is reduced, and operation may become unstable.

It is desirable to provide a storage element having sufficient thermal stability, and in which the occurrence of the spin pumping can be suppressed, as well as a memory having such storage elements.

According to an embodiment, there is provided a storage element including a storage layer, a fixed magnetization layer, a spin barrier layer, and a spin absorption layer. The storage layer stores information based on a magnetization state of a magnetic material. The fixed magnetization layer is provided for the storage layer with a tunnel insulating layer in between. The spin barrier layer suppresses diffusion of spin-polarized electrons and is provided on the side of the storage layer opposite the fixed magnetization layer. The spin absorption layer includes a nonmagnetic metal layer causing the spin pumping phenomenon and is provided on the side of the spin barrier layer opposite the storage layer. A direction of magnetization in the storage layer is changed by passing current in a layering direction to inject spin-polarized electrons so that information is recorded in the storage layer. The spin barrier layer includes at least one material selected from oxides, nitrides, and fluorides.

According to an embodiment, there is provided a memory including a storage element having a storage layer which stores information based on a magnetization state of a magnetic material, and two types of line which mutually intersect. The storage element has the configuration of the above-described storage element according to an embodiment. The storage elements are positioned in proximity to intersections of the two types of line, positioned between the two types of line. An electric current flows in the storage elements through the two types of line in a layering direction, and spin-polarized electrons are injected.

The storage element according to an embodiment has a storage layer which stores information based on the state of magnetization of a magnetic material. A fixed magnetization layer is provided for the storage layer with a tunnel insulating layer in between. A direction of magnetization in the storage layer is changed by passing a current in a layering direction to inject spin-polarized electrons so that information is recorded in the storage layer. Accordingly, information can be recorded by passing a current in the layering direction and injecting spin-polarized electrons.

Further, a spin barrier layer which suppresses the spin pumping phenomenon is provided on the side of the storage layer opposite the fixed magnetization layer and includes one or more materials selected from oxides, nitrides, and fluorides so that the spin barrier layer may suppress occurrence of the spin pumping phenomenon. Accordingly, the current for inverting the magnetization of the storage layer can be reduced, and the efficiency of spin injection can be improved. Further, the thermal stability of the storage layer can be improved by providing a spin barrier layer, so that information recorded in the storage layer can be stored with stability.

Further, since a spin absorption layer formed of a nonmagnetic metal layer causing the spin pumping phenomenon is provided on the side of the spin barrier layer opposite the storage layer, the current for inverting the magnetization of the storage layer can be further reduced compared with a configuration provided with a spin barrier layer alone, so that the spin injection efficiency can be improved.

The memory according to an embodiment has storage elements, having a storage layer which stores information based on the magnetization state of a magnetic material, and two types of line which mutually intersect. The storage elements have the configuration of the above-described storage element according to an embodiment. The storage elements are positioned in proximity to the intersections of the two types of line, positioned between the two types of line. An electric current flows in the storage elements through the two types of line in the layering direction, and spin-polarized electrons are injected, so that current flows through the two types of line in the layering direction of the storage elements, and information can be recorded through spin injection.

With spin injection, an amount of current for inverting the magnetization direction of the storage element (threshold current) can be reduced.

Further, information recorded in the storage layer of a storage element can be stored with stability.

According to an embodiment, spin injection efficiency can be improved, so that the current amount necessary for information recording can be reduced.

As a result, power consumption for the memory as a whole can be reduced.

Hence, it is possible to obtain a memory with lower power consumption than a typical memory in the past.

Further, because the storage layer in storage elements has sufficient thermal stability, the storage elements have excellent information retention characteristics.

Moreover, since the current amount necessary for information recording can be reduced, the operating region for passing a current and recording information can be expanded, and a large operating margin can be secured. Hence, a memory which operates with stability and is highly reliable can be obtained.

Additional features and advantages are described herein, and will be apparent from, the following Detailed Description and the figures.

DETAILED DESCRIPTION

Figure 1:
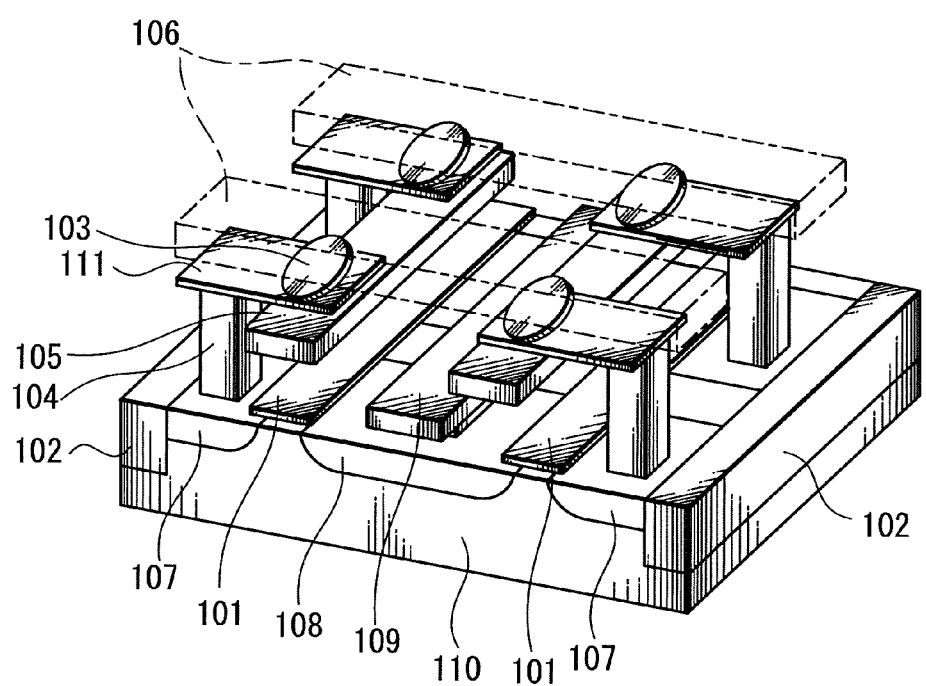
FIG. 1 is a perspective view schematically showing a configuration of a MRAM of the related art.
Figure 2:
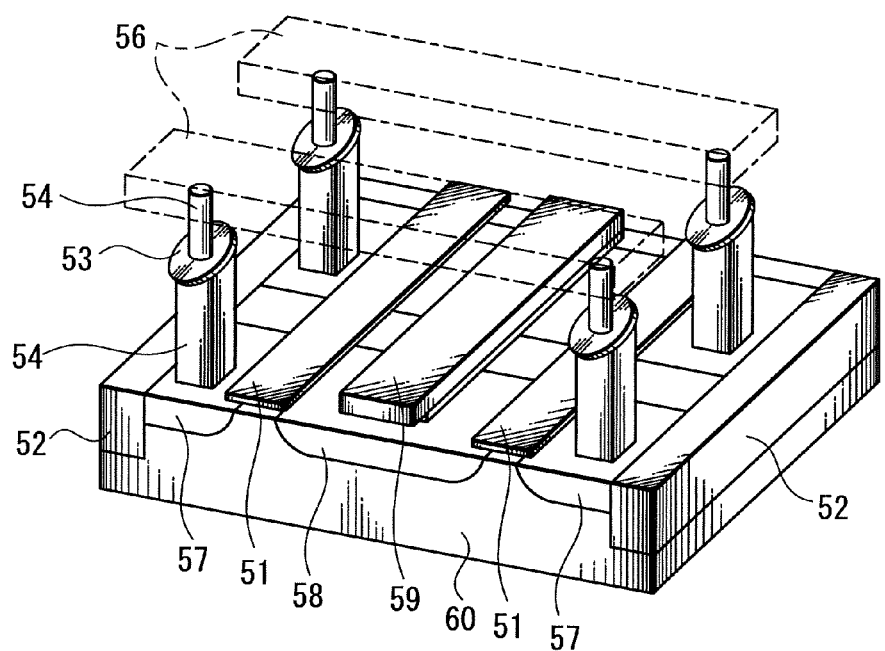
FIG. 2 is a schematic (perspective) view showing a configuration of a memory using magnetization inversion through spin injection.
Figure 3:
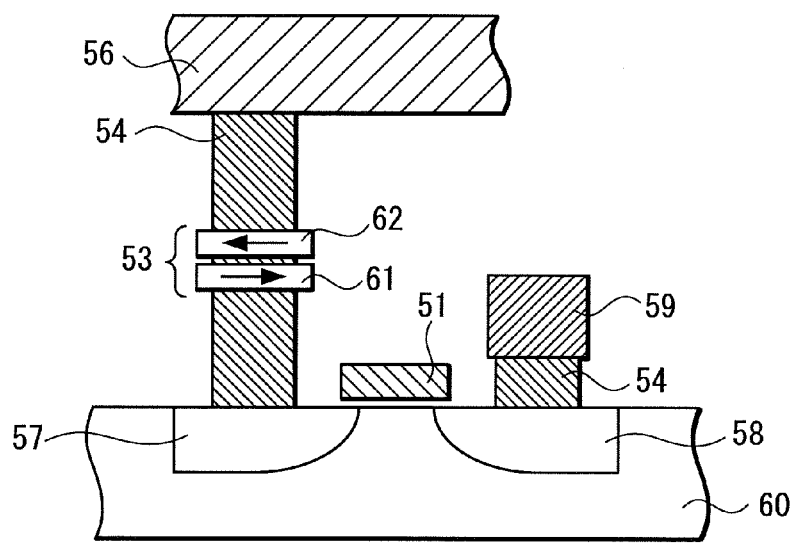
FIG. 3 is a cross-sectional view of the memory in FIG. 2.

According to an embodiment, a magnetization direction in a storage layer of a storage element is inverted by the above-described spin injection so that information is recorded. The storage layer includes a ferromagnetic layer or other magnetic material, and stores information based on a magnetization state (magnetization direction) of the magnetic material.

In a basic operation to invert the magnetization direction in a magnetic layer through spin injection, a current, equal to or greater than a certain threshold, is passed through a storage element formed of a giant magnetoresistive effect (GMR) element or a magnetic tunnel junction (MTJ) element, in the direction perpendicular to the plane of a film. At this time, the polarity (direction) of the current depends on the direction of the magnetization inverted.

If a current of absolute value smaller than the threshold is passed, magnetization inversion may not occur.

According to an embodiment, in consideration of the saturation current value of selection transistors as described above, a magnetic tunnel junction (MTJ) element using a tunnel insulating layer formed of an insulator is formed as a nonmagnetic intermediate layer between the storage layer and a fixed magnetization layer.

By forming the magnetic tunnel junction (MTJ) element using the tunnel insulating layer, the magnetoresistive change rate (MR ratio) can be large and the read signal intensity can be increased, compared with the case where a giant magnetoresistive effect (GMR) element is formed using a nonmagnetic conducting layer.

When spin injection is used to invert the direction of magnetization in the magnetic layer, the current required is characterized by formula [1] below (see, for example, F. J. Albert et al, Appl. Phys. Lett., 77. p. 3809, 2000, and similar).

$$\frac{\eta I_{c0} \tau_1}{e} = \frac{M_s V}{\mu_B} \quad \text{Formula [1]}$$

$$\tau_1 = 1/\alpha\gamma \left( H_c + \frac{1}{2} H_d \right)$$

In formula [1], Ic0 is equivalent to the current value for the magnetization in the magnetic layer at absolute zero temperature to begin precessional motion caused by spin injection. The value determines, in relative terms, the actual magnitude of the inversion current.

In order to secure a broad operating margin for the storage element and induce stable operation of the storage element, the Ic0 may need to be small.

With small Ic0, power consumption of storage elements, and of the memory as a whole, can be reduced.

Further, with small Ic0, it becomes possible to use selection transistors with low saturation current values, that is, with small gate widths, so that memory cells can be made small, and memories can further be integrated. Accordingly, the memories can be reduced in size, and storage capacities can be increased.

In the above-described formula [1], the Gilbert damping constant $\alpha$ and Ic0 are in a proportional relationship.

That is, when the Gilbert damping constant $\alpha$ is increased by the above-described spin pumping phenomenon, Ic0 increases simultaneously.

Because the above-described fact may be against efforts to secure a broad operating margin, it is essential that the spin pumping phenomenon be controlled in actual storage elements so that an increase in Ic0 may not occur. Referring to formula [1], Ic0 may be reduced by lowering the saturation magnetization Ms and volume V of the storage layer.

In order to store information recorded in a storage element, the index (parameter) Δ for the thermal stability of the storage layer may need to be maintained at or above a certain constant value. In general, it is preferable that the index Δ of thermal stability be 60 or higher, and more preferably 70 or higher.

The index Δ of thermal stability is expressed by the following equation.

$$\Delta = Ms \cdot V \cdot Hc \cdot (1/2kT) \quad (1)$$

Here k is the Boltzmann constant and T is the temperature.

As seen from the above equation (1), if the saturation magnetization Ms and volume V are reduced, the thermal stability index Δ falls.

Thus there is a trade-off between decreases in Ic0 and increases in Δ, and so the storage element may need to be configured so as to satisfy the requirements of both sides.

When a storage element is formed using an MTJ element, a GMR element, or another magnetoresistive effect element, typically an electrode layer or other nonmagnetic metal layer is connected on the side of the storage layer opposite the fixed magnetization layer, in order to pass current through the storage element.

Such nonmagnetic metal layers may be, for example, a lower electrode layer, upper electrode layer, metal underlayer, a cap layer, and the like.

If such a nonmagnetic metal layer is directly connected with the storage layer, constituent elements of the nonmagnetic metal layer diffuse into the ferromagnetic material of the storage layer by diffusion at the interface. Then, a characteristic-degraded region, in which normal characteristics of the ferromagnetic material of the storage layer are degraded, may be formed. In particular, the above-described lower electrode layer, upper electrode layer, metal underlayer, cap layer, and the like are formed to be thick (having the film thickness two to several times greater) compared with the storage layer, so that a large quantity of nonmagnetic metal elements may be diffused.

When such characteristic-degraded region occurs in the storage layer, the characteristics of the storage layer as a magnetic material are impaired, and the MR ratio, Ms, and the like are degraded.

When the MR ratio, Ms value and the like are degraded in this way, it may be difficult to read information recorded to the storage element, or the thermal stability index Δ of the storage layer may be lowered, so that the storage element becomes thermally unstable, which is undesirable for the storage element.

Hence, it is desirable that there may be no characteristic-degraded region occurred within the storage layer due to diffusion between the storage layer and the nonmagnetic metal layer.

As a result of various studies, expected characteristics of the ferromagnetic material of the storage layer have been obtained as described below. Specifically, if a spin barrier layer to suppress diffusion of spin-polarized electrons is provided on the side of the storage layer opposite the fixed magnetization layer and separates the storage layer and the nonmagnetic metal layer, the above-described spin pumping phenomenon may be suppressed. Accordingly, the spin injection efficiency may be improved. In addition, occurrence of the above-described characteristic-degraded region can be suppressed.

Further, Ic0 may be further reduced by providing a spin absorption layer formed of a nonmagnetic metal layer which causes the spin pumping phenomenon on the side of the spin barrier layer opposite the storage layer.

Hence according to an embodiment, a storage element is configured by providing a spin barrier layer to suppress diffusion of spin-polarized electrons on the side of the storage layer opposite the fixed magnetization layer. Further, the storage element includes a spin absorption layer formed of a nonmagnetic metal layer which causes the spin pumping phenomenon provided on the side of the spin barrier layer opposite the storage layer.

Further, according to an embodiment, the spin barrier layer includes one or more materials selected from oxides, nitrides, and fluorides.

That is, the spin barrier layer includes one or more types of material selected from oxides, nitrides, and fluorides, or includes one or more types of material selected from oxides, nitrides, and fluorides as the main component with small amounts of other elements (for example, metal elements or the like) added.

By thus forming the spin barrier layer from one or more types of material selected from oxides, nitrides, and fluorides, a spin barrier layer is essentially insulated.

Specifically, for example, magnesium oxide, aluminum oxide, aluminum nitride, and other compounds using elements such as magnesium and aluminum which have a strong affinity for oxygen and nitrogen, can be used.

Apart from these, various other materials such as $SiO_2$, $Bi_2O_3$, $MgF_2$, ZnO, $Ta_2O_5$, CaF, $SrTiO_2$, $AlLaO_3$, Al—N—O, and the like, can also be used.

The spin barrier layer may also be formed using the same material as the tunnel insulating layer between the storage layer and the fixed magnetization layer.

If the spin barrier layer, which suppresses diffusion of spin-polarized electrons, is thus provided to be in contact with the storage layer on the side opposite the fixed magnetization layer, the above-described spin pumping phenomenon may be suppressed, and the spin injection efficiency may be improved.

Further, since occurrence of a characteristic-degraded region due to diffusion between the storage layer and the nonmagnetic metal layer can be suppressed by the spin barrier layer which is basically insulating, expected characteristics of the ferromagnetic material of the storage layer can be obtained.

Accordingly, degradation of MR ratio due to the characteristic-degraded region can be suppressed, and the read output can be improved. As a result, for example, a thin storage layer to indicate a relative maximum spin injection efficiency can be designed. In other words, the spin injection efficiency can be improved and Ic0 can be reduced without the MR ratio or other characteristics being degraded.

Further, because occurrence of a characteristic-degraded region can be suppressed, the thickness of the storage layer can be reduced to that extent.

Since magnesium oxide (MgO) is in particular used as the material of the tunnel insulating layer, the magnetoresistive change rate (MR ratio) can be made larger than in cases where aluminum oxide has been typically employed.

In general, the spin injection efficiency depends on the MR ratio, and the higher the MR ratio, the more the spin injection efficiency η is improved, so that the magnetization inversion current density can be reduced.

Hence, when magnesium oxide is used as the material of the tunnel insulating layer constituting an intermediate layer, the write threshold current caused by spin injection can be lowered, and information can be written (recorded) using a small current. Further, the read signal intensity can be increased.

Accordingly, a sufficient MR ratio (TMR ratio) can be secured, so that the write threshold current by spin injection can be lowered, and information can be written (recorded) using a small current. Further, the read signal intensity can be increased.

When the tunnel insulating layer is formed of a magnesium oxide (MgO) film, it is desirable that the MgO film be crystallized, and that the crystal orientation be maintained in the 001 direction.

When magnesium oxide is used as the tunnel insulating layer, typically a high annealing temperature of 300° C. or higher, and more desirably 340° C. to 380° C., may be used to obtain excellent MR characteristics. Such temperature is higher than the range of annealing temperatures (250 to 280° C.) used in the case of the aluminum oxide which has been used as an intermediate layer in the related art.

This is because a high temperature may be necessary to form magnesium oxide with an appropriate internal structure and crystal structure.

If a ferromagnetic material without heat resistance to high-temperature annealing is used as the ferromagnetic layer of the storage element, excellent MR characteristics may not be obtained. However, according to an embodiment, since diffusion into the ferromagnetic layer which forms the storage layer is suppressed by providing a spin barrier layer, heat resistance of the storage layer is improved. Accordingly, magnetic characteristics of the storage layer may not be deteriorated in annealing at 340° C. to 400° C.

Further, in order to pass a sufficient write current through the storage element, a sheet resistance value of the tunnel insulating layer (tunnel barrier layer) may need to be small.

The sheet resistance of the tunnel insulating layer may need to be kept to several tens of $\Omega\text{-}\mu m2$ or lower, in view of obtaining the current density to invert the magnetization direction in the storage layer by spin injection.

In the case of a tunnel insulating layer formed of an MgO film, the thickness thereof may need to be 1.5 nm or less in order that the sheet resistance be in the above-described range.

In addition to magnesium oxide, other materials such as aluminum oxide, aluminum nitride, $SiO_2$, $Bi_2O_3$, $MgF_2$, CaF, $SrTiO_2$, $AlLaO_3$, Al—N—O, and various other insulators, dielectrics, and semiconductors can be used as the material of the tunnel insulating layer between the storage layer and the fixed magnetization layer.

Further, it is desirable that the storage element be made small so that the magnetization direction in the storage layer can be inverted easily by a small current. It is preferable that the area of the storage element be 0.04 $\mu m2$ or less.

The storage layer typically includes more than one layer mainly formed of such ferromagnetic materials as Co, Fe and Ni, each layer including an alloy of two or more types of material. The storage layer is formed of such layers stacked.

Alloy elements are added to each of the ferromagnetic layers to control the saturation magnetization and other magnetic characteristics as well as the crystal structure (crystalline structure, microcrystal structure, amorphous structure). For example, with a CoFe alloy, CoFeB alloy, Fe alloy, or NiFe alloy as the main component, Gd or another magnetic element, or, as other elements, one or a plurality of types among B, C, N, Si, P, Al, Ta, Mo, Cr, Nb, Cu, Zr, W, V, Hf, Gd, Mn, and Pd can be added. Also, amorphous material obtained by adding one or more elements selected from Zr, Hf, Nb, Ta, and Ti to Co, or Heusler materials such as CoMnSi, CoMnAl, CoCrFeAl, or the like can be used.

When using CoFeB alloy for the ferromagnetic layer forming the storage layer, it is preferable that the total content ratio of the Co and Fe which are ferromagnetic components of the storage layer be 60 atom % or higher, in view of securing sufficient magnetization and soft magnetic characteristics.

If the total content ratio of Co and Fe is 60 atom % or less, sufficient saturation magnetization and coercive force as a ferromagnetic layer may not be obtained. Further, when the Co:Fe ratio is in the range of 90:10 to 40:60, typically the magnetic anisotropy dispersion is appropriately suppressed, and satisfactory soft magnetic characteristics are obtained.

A plurality of materials or a plurality of ferromagnetic layers in different composition ranges can be directly layered to form the storage layer as well. Ferromagnetic layers and soft magnetic layers can be layered, or a plurality of ferromagnetic layers can be layered through soft magnetic layers. The advantageous results according to an embodiment may be obtained when such layering is used.

Further, according to an embodiment, if two or more ferromagnetic layers are stacked through nonmagnetic layers to form the storage layer, the saturation magnetization Ms of the storage layer can be lowered, thereby lowering the current threshold Ic0.

It is preferable that Ti, Ta, Nb, or Cr be used as the nonmagnetic layer material, where these elements may be used alone, or in an alloy.

If similar advantageous results can be obtained, other nonmagnetic elements may be used. For example, Ru, Os, Re, Ir, Au, Ag, Cu, Al, Bi, Si, B, C, Pd, Pt, Zr, Hf, W, Mo, and the like may be used.

For example, when the main component of the ferromagnetic layers of the storage layer is CoFeB and the nonmagnetic layers use one or more nonmagnetic elements selected from Ti, Ta, Nb, and Cr, it is preferable that the thickness of the nonmagnetic layer be determined such that the content of nonmagnetic elements in the entire storage layer be 1 atom % or higher and 20 atom % or lower.

If the content is low (if the nonmagnetic layers are thin), then the effect in reducing the saturation magnetization is decreased, and it is difficult to deposit ferromagnetic layers on top of nonmagnetic layers in a satisfactory state.

If the content is high (if the nonmagnetic layers are thick), then the saturation magnetization is reduced, but the storage element MR ratio is also reduced, so that reading becomes difficult.

In those cases, nonmagnetic elements are included in the storage layer mainly for the purpose of lowering the saturation magnetization Ms of the storage layer. However, oxides such as MgO, $Ta_2O_3$, and $Al_2O_3$ can also be inserted into the layered structure of the storage layer so as to improve the thermal stability index $\Delta$.

At this time, it is desirable that the thicknesses of the respective oxide layers be 0.5 nm or less so that resistance value of the storage layer may not become large.

It should be appreciated that nonmagnetic elements to lower the saturation magnetization Ms and oxides to improve the thermal stability index $\Delta$ can be added simultaneously.

Instead of stacking two or more ferromagnetic layers through nonmagnetic layers, nonmagnetic elements may be included in the ferromagnetic material of the storage layer. With such a configuration, the saturation magnetization Ms of the storage layer can be similarly reduced, and consequently the current threshold Ic0 can be lowered.

A storage layer with such configuration can be formed by, for example, using a target containing a ferromagnetic material and a nonmagnetic element, or by co-sputtering where a nonmagnetic element is mixed into the ferromagnetic material.

In these cases, the content of the nonmagnetic element is determined in a manner similar to the case of layered configuration.

When a nonmagnetic element is included in the ferromagnetic material of the storage layer, the nonmagnetic element is also distributed in the vicinity of the interface between the tunnel insulating layer and the storage layer, which may lower the MR ratio.

In other words, from the standpoint of the MR ratio, if the content is the same, a structure in which ferromagnetic layers and nonmagnetic layers are layered is advantageous.

A nonmagnetic metal material is used for the spin absorption layer provided on the side of the spin barrier layer opposite the storage layer.

According to an embodiment, the spin absorption layer is formed using a material selected such that, if the spin absorption layer were provided in direct contact with the storage layer, the spin pumping phenomenon would cause the Gilbert damping constant of the storage layer to be increased.

If the spin absorption layer is in direct contact with the storage layer, the spin pumping phenomenon occurs, but when a spin barrier layer of MgO or another material separates the spin absorption layer from the storage layer, the spin pumping phenomenon may not occur, and in addition, although the reason is not clear, the Ic0 is reduced compared with a case in which no spin absorption layer is provided.

Pt, Pd, Ru and Au may represent such materials selected and used but any material may be used as long as a similar effect is obtained. The above-described materials have short spin diffusion lengths, and materials with similarly short spin diffusion lengths can be used.

It is preferable that the thickness of the spin absorption layer be greater than the spin diffusion length of the material forming the spin absorption layer. If the thickness of the spin absorption layer is shorter than the spin diffusion length, then the spin is not sufficiently absorbed, and so the effect of providing the spin absorption layer is reduced.

According to an embodiment, it is desirable that a storage element should include the fixed magnetization layer having a unidirectional anisotropy, and it is desirable that the storage layer have a uniaxial anisotropy.

Further, it is preferable that the film thicknesses of the fixed magnetization layer and of the storage layer be 1 nm to 40 nm and 1 nm to 10 nm, respectively.

The other configuration of the storage element can be similar to the configuration of storage elements of the related art which record information through spin injection.

The fixed magnetization layer fixes the direction of the magnetization using a ferromagnetic layer alone, or using the antiferromagnetic coupling between an antiferromagnetic layer and a ferromagnetic layer.

The fixed magnetization layer has a single ferromagnetic layer, or has a layered ferrimagnetic structure in which a plurality of ferromagnetic layers are layered with nonmagnetic layers in between. When the fixed magnetization layer has a layered ferrimagnetic structure, the sensitivity to external magnetic fields of the fixed magnetization layer can be reduced, and so magnetization fluctuation in the fixed magnetization layer due to external magnetic fields can be controlled to stably operate the storage element. Further, the film thicknesses of the respective ferromagnetic layers can be adjusted, so that leakage magnetic fields from the fixed magnetization layer can be reduced.

Co, CoFe, CoFeB, and the like can be used as materials of the ferromagnetic layers in a fixed magnetization layer with a layered ferrimagnetic structure. Ru, Re, Ir, Os, and the like can be used as nonmagnetic layer materials.

FeMn alloy, PtMn alloy, PtCrMn alloy, NiMn alloy, IrMn alloy, NiO, $Fe_2O_3$, and other magnetic materials can be used as antiferromagnetic layer materials.

Ag, Cu, Au, Al, Si, Bi, Ta, B, C, O, N, Pd, Pt, Zr, Hf, Ir, W, Mo, Nb, and other nonmagnetic elements can be added to these magnetic materials to adjust the magnetic characteristics, and to adjust the crystal structure, crystallinity, stability of physical properties, and various other physical properties.

The storage element has a structure in which the storage layer may be positioned above or below the fixed magnetization layer.

As a method for reading information recorded in the storage layer of the storage element, a magnetic layer serving as information reference may be provided to the storage layer of the storage element through a thin insulating film, and information may be read by passing a ferromagnetic tunnel current flowing through the insulating layer. Alternatively, information may be read using a magnetoresistance effect.

Next, specific embodiments are described.

Figure 4:
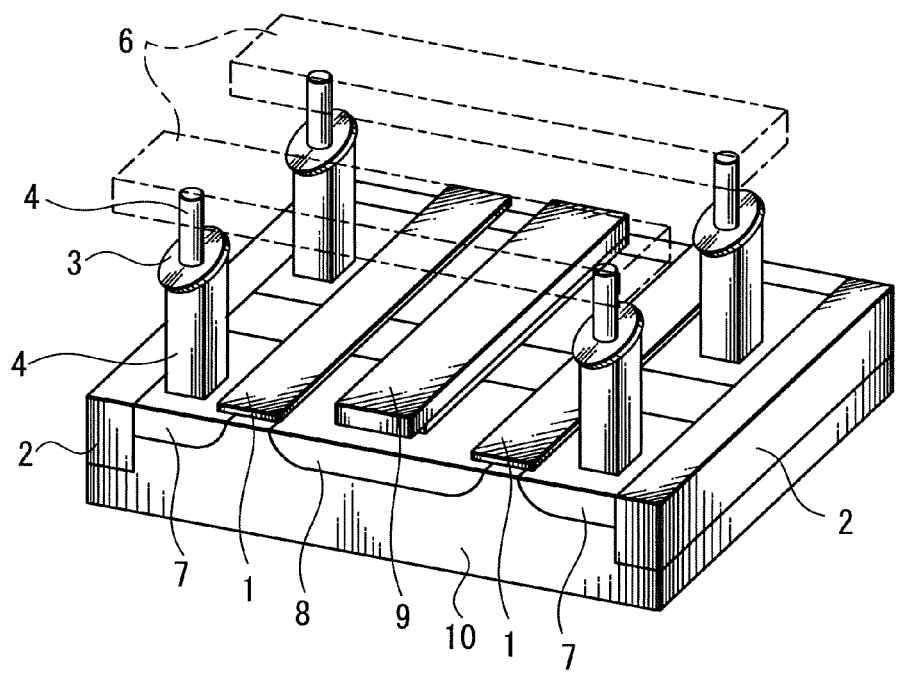
FIG. 4 is a schematic (perspective) view showing a configuration of a memory according to an embodiment.

FIG. 4 shows a schematic (perspective) view of a memory according to an embodiment.

The memory includes storage elements capable of storing information based on magnetization states and arranged in the vicinity of intersections of two types of address line (for example, word lines and bit lines) which intersect perpendicularly.

Specifically, drain regions 8, source regions 7, and gate electrodes 1, forming selection transistors used to select memory cells, are formed in portions separated by element separation layers 2 on a silicon substrate or other semiconductor substrate 10. The gate electrodes 1 also serve as address lines (for example, word lines) extending in the front-back direction in the figure. The drain regions 8 are formed to be common to selection transistors on the left and right in the figure; to these drain regions 8 are connected lines 9.

Storage elements 3 are positioned between the source regions 7, and the other address lines (for example, bit lines) 6 extending above in the right-left direction in the figure. These storage elements 3 have a storage layer formed of a ferromagnetic layer the magnetization direction of which is inverted by spin injection.

The storage element 3 is positioned in the vicinity of the intersection of the two types of address line 1 and 6.

In the storage element 3, the bit line 6 and source region 7 are connected through a vertical contact layer 4.

Accordingly, a current can be passed in the vertical direction in the storage element 3 through the two types of address line 1 and 6, and so the magnetization direction in the storage layer can be inverted by spin injection.

Figure 5:
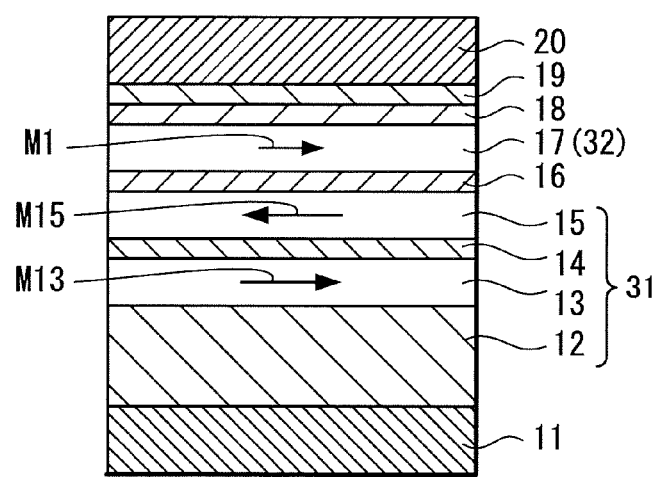
FIG. 5 is a cross-sectional view of a storage element in FIG. 4.

FIG. 5 is a cross-sectional view of the storage element 3 in the memory of this embodiment.

As shown in FIG. 5, the storage element 3 includes a fixed magnetization layer 31 below the storage layer 32, which includes a ferromagnetic layer 17 the direction of magnetization M1 of which is inverted by spin injection.

Between the storage layer 32 and the fixed magnetization layer 31 is provided an insulating layer 16 which serves as a tunnel barrier layer (tunnel insulating layer). An MTJ element is formed by the storage layer 32 and the fixed magnetization layer 31.

Below the fixed magnetization layer 31 is formed an underlayer 11, and a cap layer 20 is formed as the uppermost layer.

Further, the fixed magnetization layer 31 has an exchange-bias layered ferrimagnetic structure.

Specifically, two ferromagnetic layers 13 and 15 are layered and antiferromagnetically coupled with a nonmagnetic layer 14 in between, and an antiferromagnetic layer 12 is positioned below and adjacent to the ferromagnetic layer 13, to form the fixed magnetization layer 31. The direction of the magnetization M13 of the ferromagnetic layer 13 is fixed by the antiferromagnetic layer 12.

With the antiferromagnetic coupling of the two ferromagnetic layers 13 and 15, the magnetization M13 of the ferromagnetic layer 13 is directed rightward, and the magnetization M15 of the ferromagnetic layer 15 is directed leftward, and the two are directed in opposite directions.

As a result, the leakage magnetic flux from the ferromagnetic layer 13 and the leakage magnetic flux from the ferromagnetic layer 15 cancel each other in the fixed magnetization layer 31.

Alloy materials including one type, or two or more types selected from iron, nickel, and cobalt can be used as the material of the ferromagnetic layer 17 that is the storage layer 32, although there is no particular limitations. In addition, transition metal elements such as Nb, Zr, Gd, Ta, Ti, Mo, Mn, Cu and the like, as well as light elements such as Si, B, and C, may be included. Also, the storage layer 32 may be formed by directly stacking a plurality of films of different materials, such as a layered film of CoFeB/Ta/CoFeB.

Alloy materials including one type, or two or more types selected from iron, nickel, and cobalt can be used as the material of the ferromagnetic layers 13 and 15 in the fixed magnetization layer 31, although there is no particular limitations. In addition, transition metal elements such as Nb, Zr, Gd, Ta, Ti, Mo, Mn, Cu and the like, as well as light elements such as Si, B, and C, may be included. Also, the ferromagnetic layers 13 and 15 may be formed by directly (without any nonmagnetic layer in between) stacking a plurality of films of different materials, such as layered films of CoFe/NiFe/CoFe.

Ruthenium, copper, chromium, gold, silver, or the like can be used as the material of the nonmagnetic layer 14 forming the layered ferrimagnetic structure of the fixed magnetization layer 31.

The film thickness of the nonmagnetic layer 14 may differ depending on the material, but it is preferable that the thickness be substantially in the range of 0.5 nm to 2.5 nm.

The film thicknesses of the ferromagnetic layers 13, 15 of the fixed magnetization layer 31 and of the ferromagnetic layer 17 of the storage layer 32 can be adjusted appropriately. It is suitable that the thicknesses be 1 nm or greater and 5 nm or less.

According to an embodiment, the storage element 3 includes in particular a spin barrier layer 18 which suppresses diffusion of spin-polarized electrons and is provided on the side of the storage layer 32 opposite the fixed magnetization layer 31, that is, as the layer above the storage layer 32. Further, the storage element 3 includes a spin absorption layer 19 provided above the spin barrier layer.

The spin barrier layer 18 includes one or more types of material selected from oxides, nitrides, and fluorides.

Specifically, the spin barrier layer 18 includes one or more types of material selected from oxides, nitrides, and fluorides, or includes a material the main component of which is one or more types of material selected from oxides, nitrides, and fluorides, to which small amounts of another element (for example, a metal element, or the like) is added.

Since such spin barrier layer 18 is provided, the spin pumping phenomenon during inversion of the direction of the magnetization M1 of the storage layer 32 is suppressed.

Further, diffusion of metal elements from the spin absorption layer 19 or from the cap layer 20 into the storage layer 32 is suppressed. Accordingly, the characteristics which are normally expected of the ferromagnetic material of the storage layer 32 can be obtained, and so the thermal stability index Δ of the storage layer 32 can be large. As a result, thermal stability of the storage layer 32 is improved as well.

Further, since the spin absorption layer 19 is provided between the spin barrier layer 18 and the cap layer 20, the efficiency of spin injection is further improved, and Ic0 can be reduced.

Also, according to an embodiment, when a magnesium oxide layer is used as the insulating layer 16 which is an intermediate layer, the magnetoresistive change rate (MR ratio) can be increased.

By increasing the MR ratio as described above, the efficiency of spin injection is improved, and the current density to invert the direction of the magnetization M1 in the storage layer 17 can be reduced.

The storage elements 3 according to an embodiment can be manufactured by forming layers continuously from the underlayer 11 to the cap layer 20 in a vacuum device, and afterward by etching and performing other treatment to form the pattern of the storage elements 3.

According to the above-described embodiment, the spin barrier layer 18 including one or more types of material selected from oxides, nitrides and fluorides is provided on the side of the storage layer 32 opposite the fixed magnetization layer 31. Therefore, diffusion of spin-polarized electrons is controlled with the spin barrier layer 18. As a result, spin accumulation occurs in the storage layer 32, and the spin pumping phenomenon is suppressed during inversion of the direction of magnetization M1 in the ferromagnetic layer 17 of the storage layer 32.

Hence, deterioration of the spin injection efficiency due to the spin pumping phenomenon can be prevented, and the spin injection efficiency can be improved.

Further, since diffusion of metal elements from the cap layer 20 into the storage layer 32 is suppressed using the spin barrier layer 18 and the characteristics which are normally expected of the ferromagnetic material of the storage layer 32 can be obtained, the thermal stability index Δ of the storage layer 32 can be large. As a result, thermal stability of the storage layer 32 is improved as well.

Since the thermal stability of the storage layer 32 is improved, the operating range of the storage element 3, where a current is passed to record information, can be expanded, a broad operating margin can be secured, and the storage element 3 can operate with stability.

Hence a highly reliable memory which operates stably can be obtained.

Further, since the spin absorption layer 19 is provided on the side of the spin barrier layer 18 opposite the storage layer 32, the spin injection efficiency can be further improved, and Ic0 can be lowered.

According to the storage element 3 of an embodiment, the spin injection efficiency can be improved, so that an amount of current to invert the direction of the magnetization M1 of the storage layer 32 by spin injection can be reduced.

Hence, the power consumption of a memory including such storage elements 3 can be decreased.

When manufacturing the memory configured as shown in FIG. 4 and including the storage elements 3 shown in FIG. 5, there is an advantage that processes for forming a typical semiconductor MOS can be applied.

Hence the memory of an embodiment can be used as general-use memory.

In particular, the storage element 3 shown in FIG. 5 has the spin barrier layer 18, so that heat resistance of the storage layer 32 is improved. Accordingly, there is no degradation of the magnetic characteristics of the storage layer 32 upon annealing at 340° C. to 400° C., and processes for forming a typical semiconductor MOS can be applied easily.

Here, specific materials, film thicknesses, and the like were selected for each layer, and characteristics of a storage element having the configuration according to an embodiment.

As shown in FIG. 4, other semiconductor circuitry for switching and the like are provided in addition to the storage elements in an actual memory. Here, however, wafers on which storage elements alone were fabricated were used in studies for the purpose of obtaining the magnetization inversion characteristics of the storage layer.

EXAMPLES

A thermal oxide film of thickness 2 μm was formed on a silicon substrate of thickness 0.575 mm, and on top of this was formed a storage element 3 with the configuration shown in FIG. 5.

Specifically, the materials and film thicknesses of the storage element 3 configured as shown in FIG. 5 were selected for each layer as follows. Ta film 3 nm thick was selected as the underlayer 11. PtMn film 30 nm thick was selected as the antiferromagnetic layer 12. CoFe film 2.2 nm thick was selected as the ferromagnetic layer 13. CoFeB film 2 nm thick was selected as the ferromagnetic layer 15 of the fixed magnetization layer 31. Ru film 0.8 nm thick was selected as the nonmagnetic layer 14 of a fixed magnetization layer 31 having a layered ferrimagnetic structure. MgO film 0.8 nm thick was selected as the tunnel insulating layer 16. CoFeB (1 nm)/Ta (0.2 nm)/CoFeB (1 nm) layered film was selected as the storage layer 32. MgO film 1.1 nm thick was selected as the spin barrier layer 18. Pt or Pd film 3 nm thick was selected as the spin absorption layer 19. Ta film 5 nm thick was selected as the cap layer 20.

The storage layer 32 is a CoFeB/Ta/CoFeB layered film, differing from the ferromagnetic layer 17 shown in FIG. 5 having one layer. However, because the Ta film between the two CoFeB layers is 0.2 nm in thickness that is thin, the two CoFeB layers have magnetizations in the same direction with no antiferromagnetic coupling. Therefore, the configuration can be regarded as similar to that with the ferromagnetic layer 17 shown in FIG. 5 having one layer.

In the above film configuration, the composition of the CoFeB films is $Co_{48}Fe_{32}B_{20}$ (atom %), the composition of the CoFe film is $Co_{90}Fe_{10}$ (atom %), and the composition of the PtMn film is $Pt_{38}Mn_{62}$ (atom %).

A DC magnetron sputtering method was used to deposit each of the layers other than the tunnel insulating layer 16 and the spin barrier layer 18, which were formed from MgO.

The tunnel insulating layer 16 and spin barrier layer 18, including MgO film, were deposited using an RF magnetron sputtering method.

After depositing all the layers of the storage element 3, heat treatment was performed at 340° C. for two hours in a 10 kOe field in a heat treatment furnace with a magnetic field applied to perform ordering heat treatment of the PtMn film of the antiferromagnetic layer 12.

Next, photolithography was used to form a mask for the word line portions, after which Ar plasma was used to perform selective etching of layered film portions other than the word lines, to form the word lines (lower electrodes). At this time, portions other than the word lines were etched to a substrate depth of 5 nm.

Subsequently, an electron beam drawing device was used to form the mask of a pattern of the storage elements 3, selective etching of the layered film was performed, and the storage elements 3 were formed. Other portions than the storage elements 3 were etched to an antiferromagnetic film 12 depth of 10 nm.

An elliptical shape of minor axis length 70 nm and major axis length 250 nm was formed as the pattern of the storage elements 3.

Next, portions other than the storage elements 3 were insulated by sputtering $Al_2O_3$ having a thickness of approximately 100 nm.

Subsequently, photolithography was used to form bit lines serving as upper electrodes and pads for measurements, to complete fabrication of samples of the storage elements 3.

Further, using the above-described manufacturing method, samples of the storage elements 3 using Pt film as the spin absorption layer 19, and samples using Pd film as the spin absorption layer 19. These were used as samples in Example 1 and Example 2 respectively.

Comparative Examples

Figure 6:
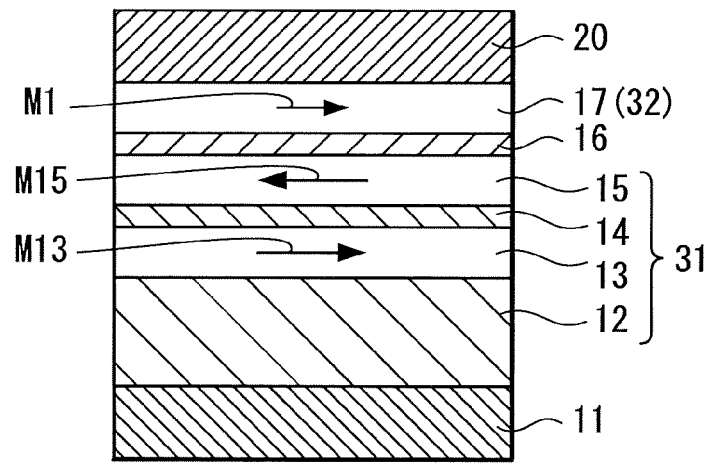
FIG. 6 is a schematic view showing a configuration of a storage element representing a comparative example.
Figure 7:
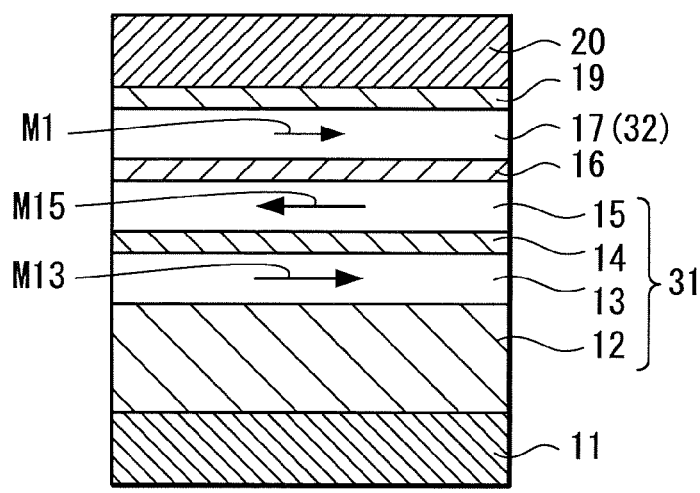
FIG. 7 is a schematic view showing a configuration of a storage element representing another comparative example.

As Comparative Example 1, a sample of a storage element 70 was fabricated, by a similar fabrication method, but having a configuration in which, as shown in the cross-sectional view of FIG. 6, no spin barrier layer 18 or spin absorption layer 19 were provided for the storage element 3 (storage layer 32/cap layer 20). As Comparative Example 2, a sample of a storage element 80 was fabricated, by a similar fabrication method, but having a configuration in which, as shown in the cross-sectional view of FIG. 7, no spin barrier layer 18 was provided for the storage element 3 (storage layer 32/spin absorption layer 19/cap layer 20). In Comparative Example 2, the spin absorption layer 19 was a Pt film.

Figure 8:
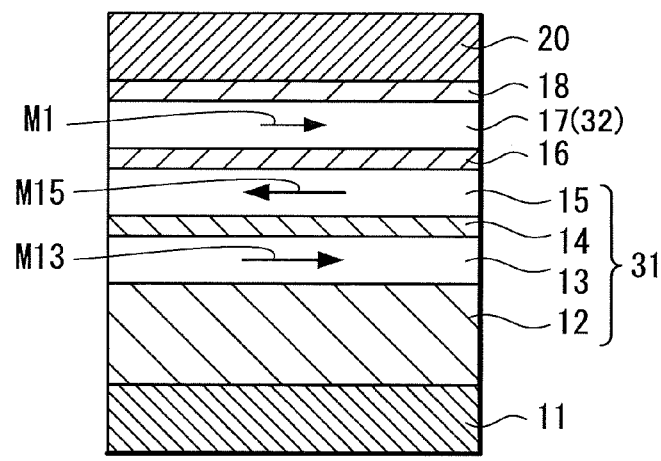
FIG. 8 is a schematic view showing a configuration of a storage element representing still another comparative example.

Further, as Comparative Example 3, a sample of a storage element 90 was fabricated, by a similar fabrication method, but having a configuration in which, as shown in the cross-sectional view of FIG. 8, no spin absorption layer 19 was provided for the storage element 3 (storage layer 32/spin barrier layer 18/cap layer 20).

Measurement of Inversion Current Ic0 and Thermal Stability Index Δ

The inversion current Ic0 and thermal stability index Δ for samples of the storage element according to each of the Examples and Comparative Examples were measured as follows.

At a finite temperature, the current Ic at which magnetization inversion occurs by spin injection is in fact different from Ic0. This is because, due to the small size of the storage element, the effects of thermal fluctuations may not be ignored.

In general, when the duration of current application is approximately 100 ns or longer, Ic<Ic0 is obtained and the thermal stability index Δ is determined according to the degree of Ic being smaller than Ic0.

Specifically, when the current application time dependence of Ic is measured and the value of Ic is plotted against the current application time on a log scale, the reciprocal of the slope is the index Δ. That is, the better the thermal stability, the more independent Ic is of the current application time.

Figure 9:
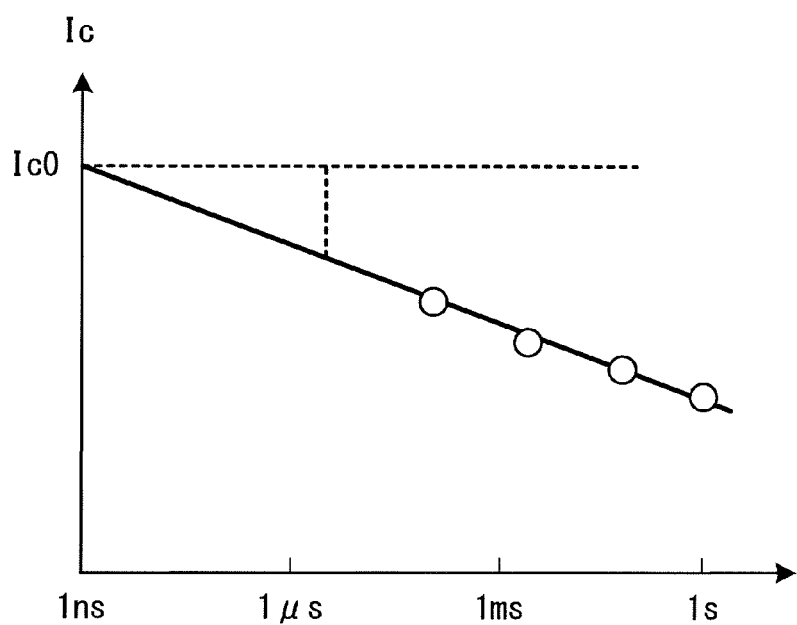
FIG. 9 shows a method of measuring the inversion current Ic0 and an index $\Delta$ of thermal stability.

The current application time dependence of Ic was measured, and as schematically shown in FIG. 9, Ic was plotted against the current application time on a log scale, and the Ic resulting when extrapolating to a current application time of 1 ns was obtained to be Ic0. In actual measurements, the current application time was varied from 10 µs to 100 ms, and measurements were repeated three times for the same current application time. Since there might be variations of storage elements, approximately 30 storage elements were fabricated having the same configuration, Ic0 and Δ were measured, and average values were calculated. Further, there might be variations in the patterns of storage elements, the value of Ic0 was divided by the area of the storage layer 32, to determine the inversion current density Jc0.

Table 1 shows measurement results for the thermal stability index Δ and the inversion current density Jc0.

TABLE 1

|  | Spin-barrier layer | Spin-absorption layer | Cap layer | Δ | Jc0 [MA/cm$^2$] |
|---|---|---|---|---|---|
| Comparative Example 1 | NA | NA | Ta(5) | 35 | 6.0 |
| Comparative Example 2 | NA | Pt(3) | Ta(5) | 51 | 13.3 |
| Comparative Example 3 | MgO(1.1) | NA | Ta(5) | 45 | 4.2 |
| Example 1 | MgO(1.1) | Pt(3) | Ta(5) | 47 | 3.3 |
| Example 2 | MgO(1.1) | Pd(3) | Ta(5) | 46 | 3.3 |

NA: not applicable

As shown in Table 1, Comparative Example 1 having the most typical configuration without a spin barrier layer 18 and spin absorption layer 19 had the results of Δ=35 and Jc0=6.0 MA/cm2.

Next, Comparative Example 3 having the spin barrier layer 18 but not having the spin absorption layer 19 had the results of Δ=45, Jc0=4.2 MA/cm2. Thus by providing a spin barrier layer 18, thermal stability is improved and moreover the inversion current is reduced, and so the configuration may be suitable for a storage element.

On the other hand, Comparative Example 2, in which a spin barrier layer 18 is not provided, but a spin absorption layer 19 of Pt is provided directly above the storage layer 32, had the results of Δ=51, Jc0=13.3 MA/cm2. Although A was further increased, the inversion current was increased, to approximately twice the value of Comparative Example 1 which indicates a typical configuration, and to approximately three times that of Comparative Example 3, which is provided with a spin barrier layer 18. This is attributed to an increase in the Gilbert damping constant of the storage layer 32, caused by the fact that the Pt, which causes the spin pumping phenomenon, is in direct contact with the storage layer 32. Since the Ic0 value is increased in such a configuration, it is disadvantageous to be used as a storage element.

On the other hand, Examples according to an embodiment include both a spin barrier layer 18 and a spin absorption layer 19. In the case of Example 1 in which the spin absorption layer 21 was a 3 nm Pt film, the results were Δ=47 and Jc0=3.3 MA/cm2, whereas in the case of Example 2 in which the spin absorption layer 21 was a 3 nm Pd film, the results were Δ=46 and Jc0=3.3 MA/cm2.

In other words, in both Examples, whereas Δ was comparable to the value of Comparative Example 3 in which only a spin barrier layer 18 was provided, Jc0 was reduced by approximately 20%. There was no significant difference between Example 1 and Example 2, and similar advantageous results were obtained regardless of the spin absorption layer 19 being a Pt film or a Pd film.

From the above results, it is shown that when a spin barrier layer 18 and spin absorption layer 19 are provided for the storage layer 32, the inversion current density can be reduced, and moreover thermal stability can be improved.

The film configuration of the storage element 3 is not limited to that described in the above embodiments, and various film configurations can be employed.

In each of the above-described embodiments, the fixed magnetization layer 3 of the storage element has an exchange-bias layered ferrimagnetic structure. However, if magnetization fixing is sufficient, a single-layer ferromagnetic layer may be used, or an antiferromagnetic layer/ferromagnetic layer structure, or a layered ferrimagnetic structure without an antiferromagnetic layer, may be used.

Respective ferromagnetic layers of the fixed magnetization layer are not limited to single layers, and a layered film including layers of different materials may be used.

Further, the storage element may be configured to have layers the layering order of which is opposite to those of the above-described embodiments.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
   a storage layer which stores information based on a magnetization state of a magnetic material, wherein the magnetization state is configured to be changed by passing a current through the means for storing information;
   a means for increasing spin pumping;
   a means for suppressing spin pumping, wherein the means for suppressing spin pumping is provided between the means for increasing spin pumping and the storage layer; and
   a cap layer provided directly adjacent to the means for increasing spin pumping opposite the means for suppressing spin pumping.

2. The storage element according to claim 1, wherein the storage layer includes a free layer, a tunnel insulating layer, and a fixed magnetization layer, wherein the fixed magnetization layer comprises an exchange-bias layered ferromagnetic structure including two ferromagnetic layers that are antiferromagnetically coupled with a nonmagnetic layer in between and an antiferromagentic layer is positioned adjacent to one of the ferromagnetic layers.

3. The storage element according to claim 2, wherein ferromagnetic layers forming the storage layer include CoFeB as a main component.

4. The storage element according to claim 3, wherein a content of a nonmagnetic element in the storage layer is 1 atom % or greater and 20 atom % or less.

5. The storage element according to claim 1, wherein the means for suppressing spin pumping comprises an oxide.

6. The storage element according to claim 1, wherein the means for suppressing spin pumping comprises a nitride.

7. The storage element according to claim 1, wherein the means for suppressing spin pumping comprises a fluoride.

8. The storage element according to claim 1, wherein the means for suppressing spin pumping is provided directly adjacent to the means for increasing spin pumping, and the means for suppressing spin pumping is provided directly adjacent to the storage layer.

9. The storage element according to claim 1, wherein an area of the storage element is less than or equal to 0.04 µm².

10. A memory comprising:
a storage element; and
two types of mutually intersecting lines,
wherein the storage element includes:
- a storage layer which stores information based on a magnetization state of a magnetic material, wherein the magnetization state is configured to be changed by passing a current through the storage layer;
- a means for increasing spin pumping;
- a means for suppressing spin pumping, wherein the means for suppressing spin pumping is provided between the means for increasing spin pumping and the storing layer; and
- a cap layer provided directly adjacent to the means for increasing spin pumping opposite the means for suppressing spin pumping.

11. The storage element according to claim 10, wherein the storage layer includes a free layer, a tunnel insulating layer, and a fixed magnetization layer, wherein the fixed magnetization layer comprises an exchange-bias layered ferromagnetic structure including two ferromagnetic layers that are antiferromagnetically coupled with a nonmagnetic layer in between and an antiferromagentic layer is positioned adjacent to one of the ferromagnetic layers.

12. The storage element according to claim 11, wherein ferromagnetic layers forming the storage layer include CoFeB as a main component.

13. The storage element according to claim 12, wherein a content of a nonmagnetic element in the storage layer is 1 atom % or greater and 20 atom % or less.

14. The storage element according to claim 10, wherein the means for suppressing spin pumping comprises an oxide.

15. The storage element according to claim 10, wherein the means for suppressing spin pumping comprises a nitride.

16. The storage element according to claim 10, wherein the means for suppressing spin pumping comprises a fluoride.

17. The storage element according to claim 10, wherein the means for suppressing spin pumping is provided directly adjacent to the means for increasing spin pumping, and the means for suppressing spin pumping is provided directly adjacent to the storage layer.

18. The storage element according to claim 10, wherein an area of the storage element is less than or equal to 0.04 µm².

* * * * *